(12) United States Patent
Son

(10) Patent No.: US 8,173,463 B2
(45) Date of Patent: May 8, 2012

(54) METHOD OF FABRICATING A LIGHT EMITTING DEVICE WITH A P-TYPE DOPANT

(75) Inventor: Hyo Kun Son, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 12/940,407

(22) Filed: Nov. 5, 2010

(65) Prior Publication Data

US 2011/0177628 A1     Jul. 21, 2011

(30) Foreign Application Priority Data

Jan. 15, 2010 (KR) .................. 10-2010-0004100

(51) Int. Cl.
*H01L 21/00* (2006.01)
(52) U.S. Cl. .......................... 438/45; 438/795
(58) Field of Classification Search .................. None
See application file for complete search history.

(56) References Cited

U.S. PATENT DOCUMENTS

| 6,242,328 | B1 | 6/2001 | Shin | |
| 6,479,313 | B1 * | 11/2002 | Ye et al. | 438/47 |
| 7,056,755 | B1 * | 6/2006 | Kamei et al. | 438/45 |
| 2002/0055274 | A1 | 5/2002 | Takeya | |
| 2007/0090369 | A1 * | 4/2007 | Kobayakawa | 257/77 |
| 2007/0296060 | A1 * | 12/2007 | Tanabe et al. | 257/609 |
| 2008/0185595 | A1 | 8/2008 | Moon et al. | |
| 2010/0291772 | A1 * | 11/2010 | Yang et al. | 438/796 |

FOREIGN PATENT DOCUMENTS

| JP | 2007-80633 A | 3/2007 |
| JP | 2008-153619 A | 7/2008 |
| KR | 10-0499117 B1 | 6/2005 |
| KR | 10-0814049 B | 3/2008 |
| KR | 10-0841575 B1 | 6/2008 |

* cited by examiner

*Primary Examiner* — Scott B Geyer
(74) *Attorney, Agent, or Firm* — Birch, Stewart, Kolasch & Birch, LLP

(57) ABSTRACT

Provided is a light emitting device fabricating apparatus, which includes a light emitting device, first and second contact parts, a power source part, a loading plate, and a chamber. The first and second contact parts are connected to the light emitting device to apply a first current to the light emitting device. The power source part supplies power to the first and second contact parts. The loading plate supports and heats the light emitting device. The chamber accommodates the light emitting device, the first and second contact parts, and the loading plate, and has a vacuum state or oxygen atmosphere.

9 Claims, 3 Drawing Sheets

METHOD OF FABRICATING A LIGHT EMITTING DEVICE WITH A P-TYPE DOPANT

CROSS-REFERENCE TO RELATED APPLICATIONS

The present application claims priority under 35 U.S.C. 119 and 35 U.S.C. 365 to Korean Patent Application No. 10-2010-0004100 (filed on Jan. 15, 2010), which is hereby incorporated by reference in its entirety.

BACKGROUND

Embodiments relate to a light emitting device fabricating apparatus and a light emitting device fabricating method using the light emitting device fabricating apparatus.

Light emitting diodes (LEDs) are semiconductor light emitting devices that convert an electric current into light. Recently, as the brightness of light emitting diodes is gradually improved, the light emitting diodes are widely used as light sources for displays, vehicles, and lighting devices. Furthermore, phosphors are used or light emitting diodes of various colors are combined to form a light emitting diode that emits efficient white light.

Various methods for improving the brightness and performance of light emitting diodes are being used. For example, an optical extraction structure, the structure of an active layer, the spreading of a current, the structure of an electrode, and the structure of a light emitting diode package may be improved.

SUMMARY

Embodiments provide a light emitting device fabricating apparatus having an improved structure, and a light emitting device fabricating method using the light emitting device fabricating apparatus.

According to the embodiments, the light emitting efficiency of a light emitting device can be improved, and an operation voltage thereof can be decreased.

In one embodiment, a light emitting device fabricating apparatus includes: a light emitting device; first and second contact parts connected to the light emitting device to apply a first current to the light emitting device; a power source part supplying power to the first and second contact parts; a loading plate supporting and heating the light emitting device; and a chamber accommodating the light emitting device, the first and second contact parts, and the loading plate, and having a vacuum state or oxygen atmosphere.

In another embodiment, a light emitting device fabricating method includes: loading a light emitting device into a chamber in a vacuum state or oxygen atmosphere; heating the light emitting device; applying a current to the light emitting device; and activating a p type dopant in a p type semiconductor layer of the light emitting device.

The details of one or more embodiments are set forth in the accompanying drawings and the description below. Other features will be apparent from the description and drawings, and from the claims.

DETAILED DESCRIPTION OF THE EMBODIMENTS

Figure 1:
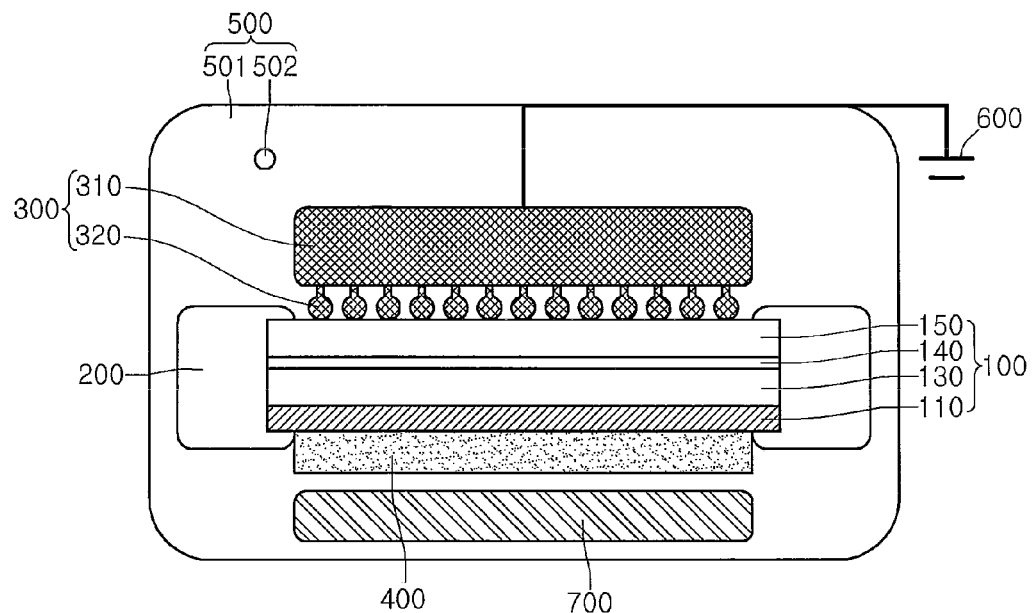
FIG. 1 is a schematic view illustrating an apparatus for fabricating a light emitting device according to an embodiment.

In the description of embodiments, it will be understood that when a layer (or film), region, pattern or structure is referred to as being 'on' or 'under' another layer (or film), region, pad or pattern, the terminology of 'on' and 'under' includes both the meanings of 'directly' and 'indirectly'. Further, the reference about 'on' and 'under' each layer will be made on the basis of drawings.

In the drawings, the thickness or size of each layer is exaggerated, omitted, or schematically illustrated for convenience in description and clarity. Also, the size of each element does not entirely reflect an actual size.

Hereinafter, a light emitting device fabricating apparatus and a light emitting device fabricating method using the light emitting device fabricating apparatus according to embodiments will be described with reference to the accompanying drawings.

FIG. 1 is a schematic view illustrating a light emitting device fabricating apparatus according to an embodiment.

Referring to FIG. 1, the light emitting device fabricating apparatus is prepared at a wafer level, and activates a light emitting device 100. The light emitting device 100 includes a first conductive type semiconductor layer 130, an active layer 140 disposed on the first conductive type semiconductor layer 130, and a second conductive type semiconductor layer 150 disposed on the active layer 140. The light emitting device fabricating apparatus includes a first contact part 200 electrically connected to the first conductive type semiconductor layer 130 of the light emitting device 100, a second contact part 300 electrically connected to the second conductive type semiconductor layer 150 of the light emitting device 100, a power source part 600 for supplying power to the first and second contact parts 200 and 300, and a chamber 500 receiving the light emitting device 100, the first contact part 200, and the second contact part 300.

The light emitting device 100 may be loaded on a loading plate 400 and supported by the loading plate 400. The loading plate 400 may support the light emitting device 100, and transfer heat to the light emitting device 100.

The light embodiment device fabricating apparatus may include an optical sensor 700 for sensing light emitted from the light emitting device 100 within the chamber 500.

Hereinafter, the light emitting device fabricating apparatus will now be described with respect to components thereof.

<Light Emitting Device 100>

The light emitting device 100 may be a wafer level light emitting device, and may include a substrate 110, the first conductive type semiconductor layer 130 disposed on the substrate 110, the active layer 140 disposed on the first conductive type semiconductor layer 130, and the second conductive type semiconductor layer 150 disposed on the active layer 140.

The substrate 110 may be formed of at least one of sapphire ($Al_2O_3$), SiC, Si, GaAs, GaN, ZnO, Si, GaP, InP, and Ge, but the present disclosure is not limited thereto.

The first conductive type semiconductor layer 130, the active layer 140, and the second conductive type semiconductor layer 150 may be disposed on the substrate 110, and are basic elements for forming a light emitting structure. The light emitting structure may be formed using a method such as metal organic chemical vapor deposition (MOCVD), chemical vapor deposition (CVD), plasma-enhanced chemical vapor deposition (PECVD), molecular beam epitaxy (MBE), and hydride vapor phase epitaxy (HVPE), but the present disclosure is not limited thereto.

For example, the first conductive type semiconductor layer 130 may include an n type semiconductor layer. The n type semiconductor layer may be formed of a semiconductor material having a composition formula of $In_xAl_yGa_{1-x-y}N$ ($0 \leq x \leq 1$, $0 \leq y \leq 1$, $0 \leq x+y \leq 1$) such as InAlGaN, GaN, AlGaN, InGaN, AlN, AlInN, or InN, and is doped with a n type dopant such as Si, Ge, or Sn.

For example, in the metal organic chemical vapor deposition (MOCVD), the first conductive type semiconductor layer 130 may be formed by injecting, into a chamber, silane ($SiH_4$) gas including an n type dopant such as silicon (Si), and at least one of trimethyl gallium (TMGa) gas, trimethyl indium (TMIn) gas, trimethyl aluminum (TMAl) gas, ammonia ($NH_3$) gas, nitrogen ($N_2$) gas, and hydrogen ($H_2$) gas, but the present disclosure is not limited thereto.

A buffer layer (not shown) and a non-conductive semiconductor layer (not shown) may be disposed between the first conductive type semiconductor layer 130 and the substrate 110. The buffer layer reduces a lattice constant difference between the first conductive type semiconductor layer 130 and the substrate 110.

The buffer layer (not shown) may be formed of a semiconductor material having a composition formula of $In_xAl_yGa_{1-x-y}N$ ($0 \leq x \leq 1$, $0 \leq y \leq 1$, $0 \leq x+y \leq 1$), such as one of InAlGaN, GaN, AlGaN, InGaN, AlN, InN, and AlInN.

Since the non-conductive semiconductor layer (not shown) is not doped with a conductive dopant, the non-conductive semiconductor layer is significantly lower in electric conductivity than the first and second semiconductor layer 130 and 150. The non-conductive semiconductor layer (not shown) may be formed of a semiconductor material having a composition formula of $In_xAl_yGa_{1-x-y}N$ ($0 \leq x \leq 1$, $0 \leq y \leq 1$, $0 \leq x+y \leq 1$), such as an undoped GaN layer, but the present disclosure is not limited thereto.

The active layer 140 may be disposed on the first conductive type semiconductor layer 130. In the active layer 140, electrons (or holes) injected through the first conductive type semiconductor layer 130 meet holes (or electrons) injected through the second conductive type semiconductor layer 150, to emit light by a band gap of an energy band according to a material of the active layer 140.

For example, the active layer 140 may includes a semiconductor material having a composition formula of $In_xAl_yGa_{1-x-y}N$ ($0 \leq x \leq 1$, $0 \leq y \leq 1$, $0 \leq x+y \leq 1$), and be formed in a single quantum well or multi quantum well (MQW) structure.

For example, in the metal organic chemical vapor deposition (MOCVD), the active layer 140 may have a multi quantum well (MQW) structure that is formed in InGaN/GaN structure by injecting trimethyl gallium (TMGa) gas, ammonia ($NH_3$) gas, nitrogen ($N_2$) gas, and trimethyl indium (TMIn) gas into a chamber, but the present disclosure is not limited thereto.

The second conductive type semiconductor layer 150 may be disposed on the active layer 140. For example, the second conductive type semiconductor layer 150 may be formed as a p type semiconductor layer. The p type semiconductor layer may be formed of a semiconductor material having a composition formula of $In_xAl_yGa_{1-x-y}N$ ($0 \leq x \leq 1$, $0 \leq y \leq 1$, $0 \leq x+y \leq 1$) such as AlN, GaN, AlGaN, InGaN, AlInGaN, AlInN, or InN, and be doped with a p type dopant such as Mg, Zn, Ca, Sr, and Ba.

For example, in the metal organic chemical vapor deposition (MOCVD), the second conductive type semiconductor layer 150 may be formed by injecting, into a chamber, bis (ethylcyclopentadienyl) magnesium ($EtCp_2Mg$)Mg ($C_2H_5C_5H_4$) including a p type dopant such as magnesium (Mg), and at least one of trimethyl gallium (TMGa) gas, trimethyl indium (TMIn) gas, trimethyl aluminum (TMAl) gas, ammonia (NH3) gas, nitrogen ($N_2$) gas, and hydrogen ($H_2$) gas, but the present disclosure is not limited thereto.

The first conductive type semiconductor layer 130 may include a p type semiconductor layer, and the second conductive type semiconductor layer 150 may include an n type semiconductor layer. A third conductive type semiconductor layer (not shown) having an opposite pole to that of the second conductive type semiconductor layer 150 may be disposed on the second conductive type semiconductor layer 150. Thus, the light emitting device 100 may have a bonding structure with one of pn, np, pnp, and npn, but the present disclosure is not limited thereto.

(First Contact Part 200)

The first contact part 200 is electrically connected to the first conductive type semiconductor layer 130 of the light emitting device 100. The first contact part 200 is disposed along a periphery of the light emitting device 100, and is electrically connected to the first conductive type semiconductor layer 130 by contacting at least a side surface of the first conductive type semiconductor layer 130.

The first contact part 200 receives power from the power source part 600 and supplies the power to the first conductive type semiconductor layer 130 of the light emitting device 100. To this end, the first contact part 200 may be electrically connected to the power source part 600 through a member such as a wire.

The first contact part 200 may be formed of a conductive material.

For example, the first contact part 200 may be formed of a conductive rubber including a black pigment and/or a metal fiber. Since the conductive rubber has a high surface friction coefficient, the first contact part 200 can be securely fixed to the light emitting device 100.

The first contact part 200 may be formed of metal, but the present disclosure is not limited thereto.

As illustrated in FIG. 1, the first contact part 200 has an approximately U shaped inner surface to be in contact with the side, upper, and lower surfaces of the light emitting device 100. That is, the first contact part 200 may contact the first conductive type semiconductor layer 130, the active layer 140, and the second conductive type semiconductor layer 150.

Although the first contact part 200 is configured as described above, when the first conductive type semiconductor layer 130 includes a p type dopant such as Mg, since a resistance value of the first conductive type semiconductor layer 130 is smaller than those of the active layer 140 and the second conductive type semiconductor layer 150, power applied from the first contact part 200 to the light emitting device 100 flows only through the first conductive type semiconductor layer 130 to prevent a short circuit between the first conductive type semiconductor layer 130, the active layer 140, and the second conductive type semiconductor layer 150.

The shape of the first contact part 200 may be varied according to a design for the light emitting device fabricating apparatus.

(Second Contact Part 300)

The second contact part 300 is electrically connected to the second conductive type semiconductor layer 150 of the light emitting device 100. The second contact part 300 contacts the upper surface of the second conductive type semiconductor layer 150, and thus, is electrically connected to the second conductive type semiconductor layer 150.

The second contact part 300 may receive power from the power source part 600 and supply the power to the second conductive type semiconductor layer 150 of the light emitting device 100. To this end, the second contact part 300 may be electrically connected to the power source part 600 through a member such as a wire.

The second contact part 300 may include a contact body 310 and a plurality of probes 320 provided to the contact body 310.

The contact body 310 is formed of a conductive material such as a metal including at least one of copper (Cu), aluminum (Al), silver (Ag), nickel (Ni), stannum (Sn), gold (Au), titanium (Ti), and zinc (Zn), or include a substrate such as a printed circuit board (PCB), but the present disclosure is not limited thereto.

The probes 320 may protrude from the lower surface of the contact body 310 and be in dot contact with the upper surface of the second conductive type semiconductor layer 150. The ends of the probes 320 may have sphere shapes as illustrated in FIG. 1, but the present disclosure is not limited thereto.

For example, the probes 320 may be formed of metal or conductive rubber, but the present disclosure is not limited thereto. Since the conductive rubber is the same as the previous one, a description thereof will be omitted.

Since power is applied from the power source part 600 with the probes 320 in dot contact with the second conductive type semiconductor layer 150, hydrogen $H_2$ and water $H_2O$ generated from the second conductive type semiconductor layer 150 while activating the light emitting device 100 are effectively discharged to the outside, which will be described in detail later.

The second contact part 300 may include the contact body 310 without the probes 320. In this case, the contact body 310 may be in surface contact with the upper surface of the second conductive type semiconductor layer 150.

(Loading Plate 400)

The loading plate 400 may disposed below the light emitting device 100, and support the light emitting device 100.

The loading plate 400 may have a shape corresponding to the shape of the light emitting device 100 at a wafer level.

The loading plate 400 may include a material that effectively transfers heat, and be thermally connected to a heat generating unit such as a heater that is disposed at the inside or outside of the chamber 500 to heat the light emitting device 100 in the method of fabricating the light emitting device 100.

The loading plate 400 may be formed of quartz that is transparent with high thermal conductivity, or be formed of transparent resin including a heat transfer coil. However, the material of the loading plate 400 is not limited thereto.

(Chamber 500)

The chamber 500 may accommodate the light emitting device 100, the first and second contact parts 200 and 300, and the loading plate 400. The chamber 500 may further accommodate various devices including the optical sensor 700 and the heat generating unit.

The chamber 500 may include a chamber body 501 sealed from the outside, and a gas entrance 502 provided to a side wall of the chamber body 501 to introduce or discharge gas such as oxygen ($O_2$) and nitrogen ($N_2$).

The chamber body 501 may be formed of a material providing high pressure resistance, high thermal insulation, and high sealing performance from the outside.

The gas entrance 502 may be coupled with a gas introduction port (not shown) for introducing gas supplied from a gas supply source (not shown) and discharging gas to the outside, and be coupled with a vacuum pump (not shown) for evacuating the interior of the chamber body 501, but the present disclosure is not limited thereto.

(Optical Sensor 700)

When the light emitting device 100 emits light by power supplied from the power source part 600 in the light emitting device fabricating method, the optical sensor 700 senses the light to provide a light emitting image of the light emitting device 100.

For example, the optical sensor 700 may be a photo sensor and/or a charge coupled device (CCD) camera, but the present disclosure is not limited thereto.

The optical sensor 700 may be disposed at a position for effectively sensing light emitted from the light emitting device 100. For example, when the loading plate 400 is formed of a transparent material, the optical sensor 700 may be disposed below the loading plate 400, but the present disclosure is not limited thereto.

In the light emitting device fabricating method, a defect of the light emitting device 100 may be checked through a light emitting image provided from the optical sensor 700. That is, on the light emitting image, a defective region of the light emitting device 100 looks darker than the other regions. Thus, the number or areas of dark regions may be analyzed to check whether the light emitting device 100 has a defect.

Thus, before quality inspection is separately performed, when the light emitting device 100 is fabricated at a wafer level, it can be detected in advance whether the light emitting device 100 has a defect, thereby efficiently fabricating the light emitting device.

Hereinafter, a light emitting device fabricating method using a light emitting device fabricating apparatus according to an embodiment will now be described with reference to FIGS. 2 to 4.

(First Fabricating Method)

Figure 2:
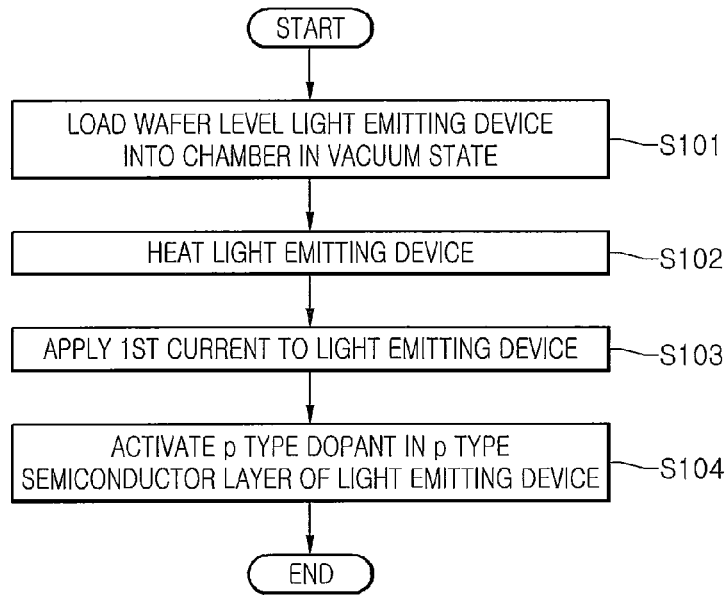
FIG. 2 is a flowchart illustrating a first fabricating method for a light emitting device according to an embodiment.

FIG. 2 is a flowchart illustrating a first fabricating method for a light emitting device according to an embodiment.

Referring to FIG. 2, the light emitting device 100 with a wafer level is loaded into the chamber 500 with a vacuum state in operation S101.

For example, the vacuum state may be a pressure ranging from about 0 torr to about $10^{-7}$ torr. The vacuum state may be obtained by discharging gas out of the chamber 500 through the gas entrance 502.

The light emitting device 100 may be disposed on the loading plate 400 in the chamber 500. At this point, the light emitting device 100 is electrically connected to the first and second contact parts 200 and 300 to receive power from the power source part 600.

In detail, the first contact part 200 may be electrically connected to the first conductive type semiconductor layer 130 of the light emitting device 100, and the second contact part 300 may be electrically connected to the second conductive type semiconductor layer 150 of the light emitting device 100.

Next, the light emitting device 100 is heated in operation S102.

At this point, heat generated from a heat generating unit such as a heater disposed at the inside or outside of the chamber 500 may be transferred to the light emitting device 100 through the loading plate 400.

For example, the light emitting device 100 may be heated to a temperature ranging from about 10° C. to about 900° C., particularly, to a temperature of about 100° C. This is a temperature range for effectively activating the light emitting device 100 without damage.

Next, when a first current is applied to the light emitting device 100 in operation S103, a p type dopant in a p type semiconductor layer of the light emitting device 100 is activated in operation S104.

The first current is supplied from the power source part 600, and is transmitted to the light emitting device 100 through the first and second contact parts 200 and 300. That is, the first and second contact parts 200 and 300 function as positive and negative electrodes to apply the first current from the power source part 600 to the light emitting device 100.

The first current may range from about 1 A to about 3 A, particularly, be a current of about 2 A, but the present disclosure is not limited thereto.

When the first current is applied to the light emitting device 100, an inner resistance of the light emitting device 100 heats the light emitting device 100. Heating energy due to the inner resistance activates lattices of the light emitting device 100.

Specifically, the heating energy activates a p type semiconductor layer of the light emitting device 100, that is, a p type dopant included in one of the first or second conductive type semiconductor layer 130 or 150 to improve the light emitting efficiency of the light emitting device 100 and decrease the operation voltage thereof.

In detail, for example, when the p type dopant is magnesium (Mg) and is included in the second conductive type semiconductor layer 150, the p type dopant has Mg—H bonds.

Since magnesium (Mg) of Mg—H bonds does not function as a p type dopant, rather, functions as a resistor in a semiconductor layer, the light emitting efficiency of the light emitting device 100 may be degraded and an operation voltage thereof may be increased.

Thus, although the Mg—H bonds are broken through a thermal process such as annealing to activate magnesium (Mg) in a typical light emitting device fabricating method, it is difficult for the annealing to uniformly distribute activated magnesium into a semiconductor layer, and thus, the light emitting efficiency of a light emitting device may be degraded and the operation voltage thereof may be increased.

However, in the light emitting device fabricating method according to the embodiment, the heating energy generated by the first current effectively breaks the Mg—H bonds to effectively activate the p type dopant, that is, magnesium (Mg). In addition, the p type dopant such as magnesium (Mg) is rearranged by an electric field applied by the first and second contact parts 200 and 300, and thus, is uniformly distributed within the light emitting device 100. Thus, the light emitting efficiency of the light emitting device 100 is improved, the Mg—H bonds, which function as resistors, are removed to decrease the operation voltage thereof.

In the light emitting device fabricating method, hydrogen (H) generated by breaking the Mg—H bonds may be discharged in the form of hydrogen gas ($H_2$) out of the light emitting device 100. At this point, since the interior of the chamber 500 is in a vacuum state, hydrogen gas ($H_2$) generated in the light emitting device 100 by the heating energy is effectively discharged out of the light emitting device 100 by a pressure difference due to the vacuum state.

As described above, since the second contact part 300 includes the probes 320 to be in dot contact with the upper surface of the second conductive type semiconductor layer 150, the hydrogen gas H2 can be effectively distributed between the probes 320 through the upper surface of the second conductive type semiconductor layer 150.

Figure 4:
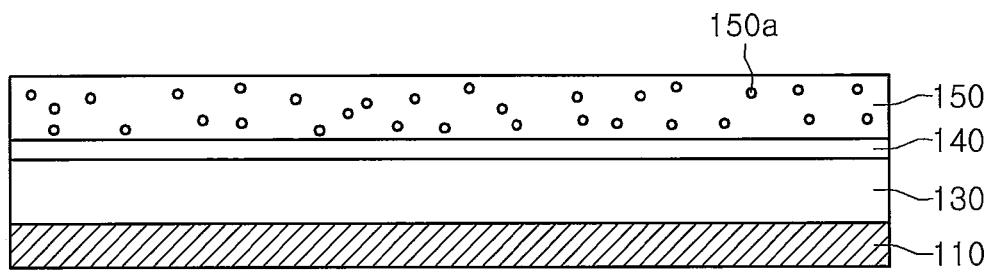
FIG. 4 is a cross-sectional view illustrating a light emitting device activated according to the methods of FIGS. 2 and 3.

That is, as illustrated in FIG. 4, in the state where the light emitting device 100 having a stacked structure as illustrated FIG. 1 is activated, when the second conductive type semiconductor layer 150 disposed on the active layer 140 is a p type semiconductor layer, a p type dopant 150a included in the p type semiconductor layer is uniformly distributed in an activated state along the depth of the second conductive type semiconductor layer 150.

That is, lattices are activated according to a high voltage, and the p type dopant 150a such as magnesium (Mg) is released and activated from Mg—H bonds, and is rearranged by an electric field applied through the first and second contact parts 200 and 300, and thus, is uniformly distributed within the light emitting device 100.

Thus, the light emitting efficiency of the light emitting device 100 can be improved, and the operation voltage thereof can be decreased.

(Second Fabricating Method)

Figure 3:
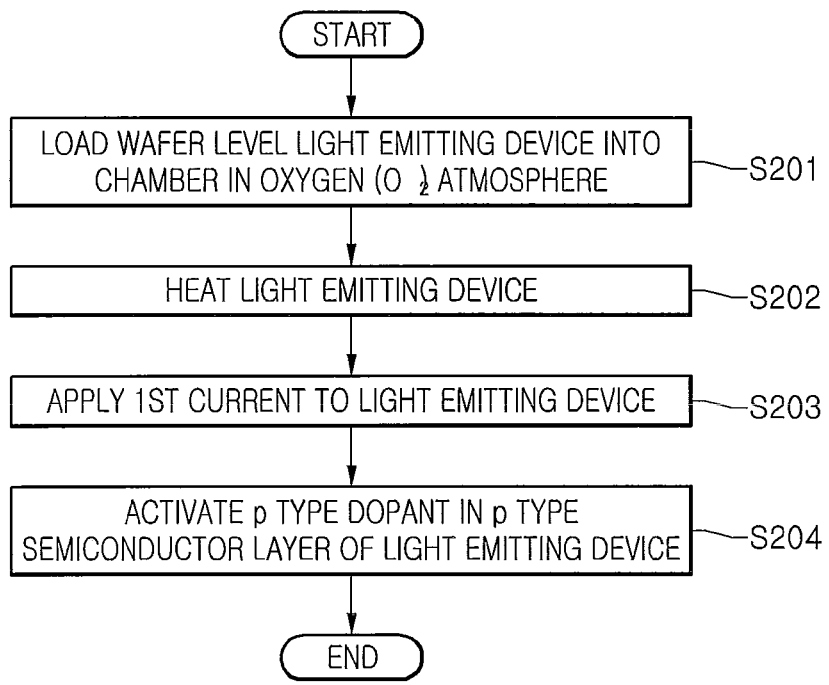
FIG. 3 is a flowchart illustrating a second fabricating method for a light emitting device according to an embodiment.

FIG. 3 is a flowchart illustrating a second fabricating method for a light emitting device according to an embodiment.

The same parts of the second fabricating method as those of the previous one will be described briefly or a description thereof will be omitted.

Referring to FIG. 3, the light emitting device 100 with a wafer level is loaded into the chamber 500 with oxygen ($O_2$) atmosphere in operation S201.

For example, the oxygen ($O_2$) atmosphere may have a pressure ranging from about 0.1 to about 10 torr. The oxygen ($O_2$) atmosphere may be formed by introducing oxygen ($O_2$) gas into the chamber 500 through the gas entrance 502.

The light emitting device 100 may be disposed on the loading plate 400 in the chamber 500. At this point, the light emitting device 100 is electrically connected to the first and second contact parts 200 and 300 to receive power from the power source part 600.

Next, the light emitting device 100 is heated in operation S202.

At this point, heat generated from a heat generating unit such as a heater disposed at the inside or outside of the chamber 500 may be transferred to the light emitting device 100 through the loading plate 400.

For example, the light emitting device 100 may be heated to a temperature ranging from about 10° C. to about 900° C., particularly, to a temperature of about 100° C. This is a temperature range for effectively activating the light emitting device 100 without damage.

Next, when a first current is applied to the light emitting device 100 in operation S203, a p type dopant in a p type semiconductor layer of the light emitting device 100 is activated in operation S204.

The first current may range from about 1 A to about 3 A, particularly, be a current of about 2 A, but the present disclosure is not limited thereto.

When the first current is applied to the light emitting device 100, an inner resistance of the light emitting device 100 heats the light emitting device 100. The heating energy activates a p type semiconductor layer of the light emitting device 100, that is, a p type dopant included in one of the first or second conductive type semiconductor layer 130 or 150 to improve the light emitting efficiency of the light emitting device 100 and decrease the operation voltage thereof.

In the second fabricating method, hydrogen (H) generated by breaking the Mg—H bonds may be coupled with oxygen ($O_2$) gas, and be discharged in the form of water ($H_2O$) out of the light emitting device 100. At this point, the hydrogen H and the oxygen ($O_2$) gas form hydrogen bonds to decrease a hydrogen (H) concentration in the light emitting device 100.

As described above, since the second contact part 300 includes the probes 320 to be in dot contact with the upper surface of the second conductive type semiconductor layer 150, the water $H_2O$ can be effectively distributed between the probes 320 through the upper surface of the second conductive type semiconductor layer 150.

Since the p type dopant included in the p type semiconductor layer of the light emitting device 100 fabricated using the second fabricating method is uniformly distributed in an activated state in the entire region of the p type semiconductor layer, the light emitting efficiency of the light emitting device 100 can be improved, and the operation voltage thereof can be decreased.

Hereinafter, a light emitting device quality inspection method using a light emitting device fabricating method will now be described according to an embodiment.

Figure 5:
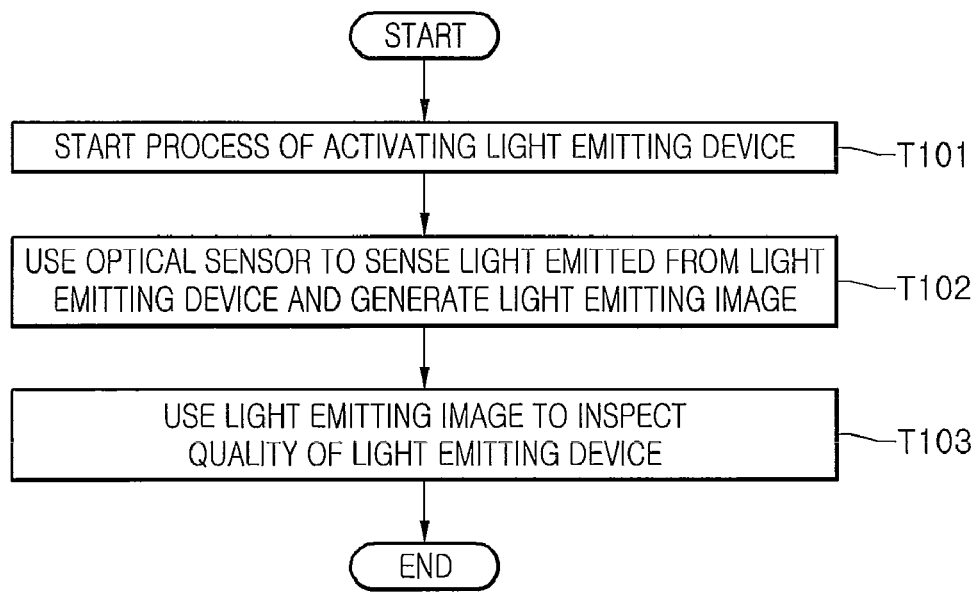
FIG. 5 is a flowchart illustrating a light emitting device quality inspection method using a light emitting device fabricating method according to an embodiment.

FIG. 5 is a flowchart illustrating a light emitting device quality inspection method using a light emitting device fabricating method according to an embodiment.

Referring to FIG. 5, first, the light emitting device fabricating method is performed in operation T101. The light emitting device fabricating method may include the first or second fabricating method.

In the light emitting device fabricating method, the light emitting device 100 may emit light by power applied from the power source part 600.

Next, the optical sensor 700 senses light emitted from the light emitting device 100 to generate a light emitting image in operation T102.

For example, the optical sensor 700 may be a photo sensor or a charge coupled device (CCD) camera, but the present disclosure is not limited thereto.

Next, the light emitting image is used to inspect the quality of the light emitting device 100 in operation T103.

On the light emitting image, a defective region of the light emitting device 100 looks darker than the other regions. Thus, the number or areas of dark regions may be analyzed to check whether the light emitting device 100 has a defect.

Thus, before quality inspection is separately performed, when the light emitting device 100 is fabricated at a wafer level, it can be detected in advance whether the light emitting device 100 has a defect, thereby efficiently fabricating the light emitting device.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device fabricating method comprising:
   loading a light emitting device into a chamber in a vacuum state or oxygen atmosphere;
   heating the light emitting device;
   applying a current to the light emitting device; and
   activating a p type dopant in a p type semiconductor layer of the light emitting device,
   wherein the p type dopant is magnesium (Mg), and the p type dopant is activated by breaking a Mg—H bond, and
   wherein hydrogen ($H_2$) gas or water ($H_2O$) is discharged out of the light emitting device when the p type dopant is activated by breaking the Mg—H bond.

2. The method according to claim 1, wherein the vacuum state has a pressure ranging from about 0 torr to about $10_{-7}$ torr.

3. The method according to claim 1, wherein the oxygen atmosphere has a pressure ranging from about 0.1 torr to about 10 torr.

4. The method according to claim 1, wherein the current ranges from about 1 A to about 3 A.

5. The method according to claim 1, wherein the heating of the light emitting device comprises heating the light emitting device to a temperature ranging from about 10° C. to about 900° C.

6. The method according to claim 1, further comprising, after the p type dopant is activated, applying a current to the light emitting device to generate a light emitting image of the light emitting device and inspect a quality of the light emitting device.

7. The method according to claim 6, wherein the inspecting of the quality of the light emitting device comprises disposing an optical sensor below the light emitting device to generate the light emitting image of the light emitting device.

8. The method according to claim 1, wherein in the applying of the current to the light emitting device comprises, a contact part for supplying the current is in dot contact with an upper portion of the p type semiconductor layer of the light emitting device.

9. The method according to claim 1, wherein the loading of the light emitting device comprises loading a wafer level light emitting device into the chamber.

* * * * *